(12) United States Patent
Matsui et al.

(10) Patent No.: US 6,783,658 B2
(45) Date of Patent: Aug. 31, 2004

(54) ELECTROPOLISHING METHOD

(75) Inventors: Yoshitaka Matsui, Yokohama (JP);
Hiroshi Kosukegawa, Yokohama (JP);
Masako Kodera, Yokohama (JP);
Naoto Miyashita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/261,949

(22) Filed: Oct. 2, 2002

(65) Prior Publication Data

US 2003/0066760 A1 Apr. 10, 2003

(30) Foreign Application Priority Data

Oct. 3, 2001 (JP) ..................................... 2001-307608

(51) Int. Cl.$^7$ .......................... B23H 11/00; B23H 3/00; B23H 5/00
(52) U.S. Cl. ...................................... 205/640; 205/645
(58) Field of Search ................................ 205/640, 645

(56) References Cited

U.S. PATENT DOCUMENTS 5,567,300 A    10/1996  Datta et al.
6,139,716 A *  10/2000  McCarthy et al. .......... 205/665
6,514,400 B1 *  2/2003  Matsukawa ................. 205/649
6,652,658 B1 * 11/2003  Mori et al. ..................... 134/1

FOREIGN PATENT DOCUMENTS

JP         2001-326204        11/2001

* cited by examiner

Primary Examiner—Wesley A. Nicolas
(74) Attorney, Agent, or Firm—Finnegan, Henderson, Farabow, Garrett & Dunner, L.L.P.

(57) ABSTRACT

A target material is electropolished by applying a voltage between an anode electrode and a counter electrode while bringing the anode electrode into contact with the surface of the target material. The anode electrode is formed of an electrode material having a current density not higher than 10 mA/cm$^2$ upon application of a voltage of +2.5V vs. silver/silver chloride electrode within a 0.1 M perchloric acid solution in an electrochemical measurement using a potentiostat.

18 Claims, 3 Drawing Sheets ns
ELECTROPOLISHING METHOD

CROSS-REFERENCE TO RELATED APPLICATIONS

This application is based upon and claims the benefit of priority from the prior Japanese Patent Application No. 2001-307608, filed Oct. 3, 2001, the entire contents of which are incorporated herein by reference.

BACKGROUND OF THE INVENTION

1. Field of the Invention

The present invention relates to a method of electropolishing a metallic material.

2. Description of the Related Art

A metal burying wiring technology is utilized in the manufacture of a semiconductor device. In forming a buried metallic wiring layer, an insulating film is formed first on a semiconductor substrate, followed by forming a wiring groove of a prescribed pattern within the insulating film. A barrier layer is formed on the inner surface of the wiring groove and on the surface of the insulating film. Then, a metallic wiring material is deposited, filling the wiring groove and covering the barrier layer portion formed on the surface of the insulating film. Further, a portion of the metallic wiring material other than that portion of the metallic wiring material that is present inside the wiring groove is subjected to an electropolishing. The electropolishing is performed until the surface of the barrier layer formed on the surface of the insulating film is exposed. After the electropolishing step, the barrier metal on the surface of the insulating film is removed by a chemical mechanical polishing (CMP) technology. It is advantageous to carry out the electropolishing treatment by applying a voltage across an anode electrode and a counter electrode while bringing the anode electrode into contact with the surface of the metallic wiring material (material subjected to the electropolishing) within the electrolytic solution.

It has been customary to use platinum as the anode electrode in the electropolishing referred to above. It has been found, however, that oxygen tends to be generated on the platinum anode electrode in subjecting a wiring material made of a noble metal such as ruthenium to an electropolishing by using the platinum anode electrode. If oxygen is generated on the platinum anode electrode during the electropolishing, electricity is consumed, resulting in failure to dissolve the noble metal wiring material.

The oxygen generation is not the problem encountered only when the platinum anode electrode and the noble metal wiring material are used in combination. In general, oxygen is generated when the reductant such as OH⁻ within the electrolytic solution is brought into contact with the surface of an anode electrode so as to deprive the anode electrode of an electron and, thus, to be converted into an oxidant such as $O_2$. As a result, the current efficiency is lowered during the electropolishing treatment.

What should also be noted is that, in the ordinary electropolishing treatment, the electric field is not stabilized during the electropolishing treatment because of the diffusion of the electrolytic solution, the generation of hydrogen on the counter electrode, and the difference in the intensity of the electric field between the central portion and the edge portion of the counter electrode. As a result, a local electropolishing is generated in the material subjected to the electropolishing treatment.

BRIEF SUMMARY OF THE INVENTION

According to a first aspect of the present invention, there is provided an electropolishing method, comprising applying a voltage across an anode electrode and a counter electrode within an electrolytic solution while bringing the anode electrode into contact with a surface of a target material, thereby electropolishing the target material, wherein the anode electrode is formed of an electrode material having a current density not higher than 10 mA/cm² upon application of a voltage of +2.5V vs. silver/silver chloride electrode within a 0.1 M perchloric acid solution in an electrochemical measurement using a potentiostat.

According to a second aspect of the present invention, there is provided an electropolishing method, comprising applying a voltage across an anode electrode and a counter electrode within an electrolytic solution while bringing the anode electrode into contact with a surface of a target material, thereby electropolishing the target material, wherein the anode electrode has an insulating film provided on a side surface thereof.

Further, according to a third aspect of the present invention, there is provided an electropolishing method, comprising applying a voltage across an anode electrode and a counter electrode within an electrolytic solution while bringing the anode electrode into contact with a surface of a target material, thereby electropolishing the target material, wherein the counter electrode has a solid electrolyte film, an ion exchange resin film or a resistivity film formed on a surface thereof.

DETAILED DESCRIPTION OF THE INVENTION

Embodiments of the present invention will now be described in detail.

First of all, an example in which an electropolishing method according to one embodiment of the present invention is applied to a formation of a buried wiring layer in a semiconductor device will now be described with reference to FIGS. 1 to 6.

Figure 1:
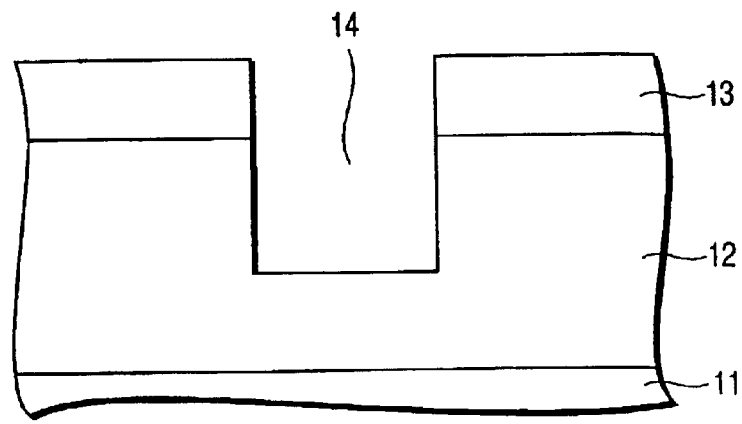
FIGS. 1 to 6 show cross sectional views schematically illustrating a method of forming a buried wiring layer by applying one embodiment of an electropolishing method according to one embodiment of the present invention.

As shown in FIG. 1, an insulating film 12 (e.g., a low-k plasma silicon oxide film) is formed on a semiconductor substrate 11. Then, a wiring groove 14 is formed in the insulating film 12 by a reactive ion etching (RIE) method with a photoresist film 13 used as a mask.

Figure 2:
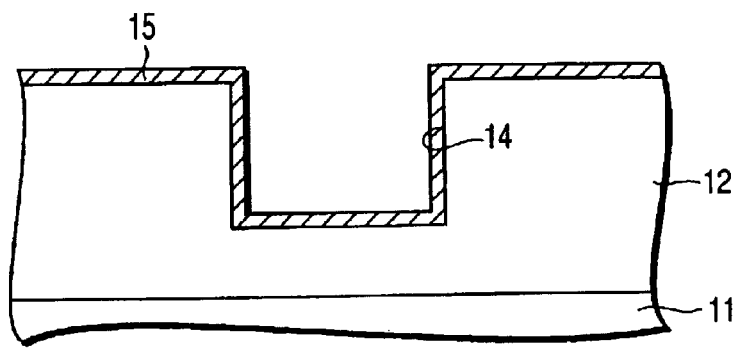

In the next step, the photoresist film 13 is removed by, for example, an oxygen plasma ashing method, followed by forming a barrier layer 15 such as a titanium nitride layer on the inner surface of the formed wiring groove 14 and on the upper surface of the insulating film 12, as shown in FIG. 2.

Figure 3:
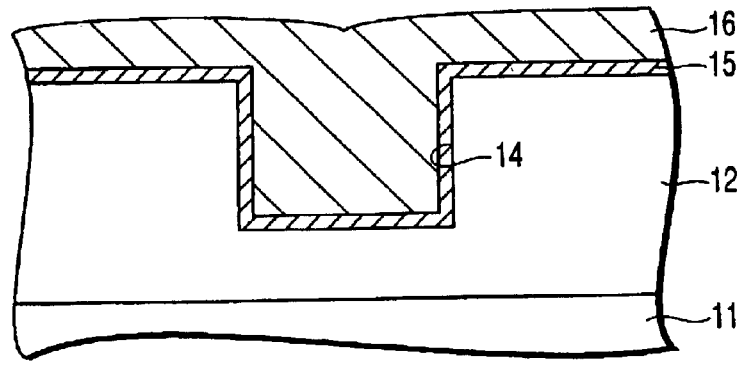

After formation of the barrier layer 15, a metallic wiring material 16 is formed by, for example, a CVD method, filling the wiring groove 14 and covering the upper surface of the barrier layer 15, as shown in FIG. 3. The metallic wiring material may be Cu, W, Ru, Ag, and/or Al.

Figure 4:
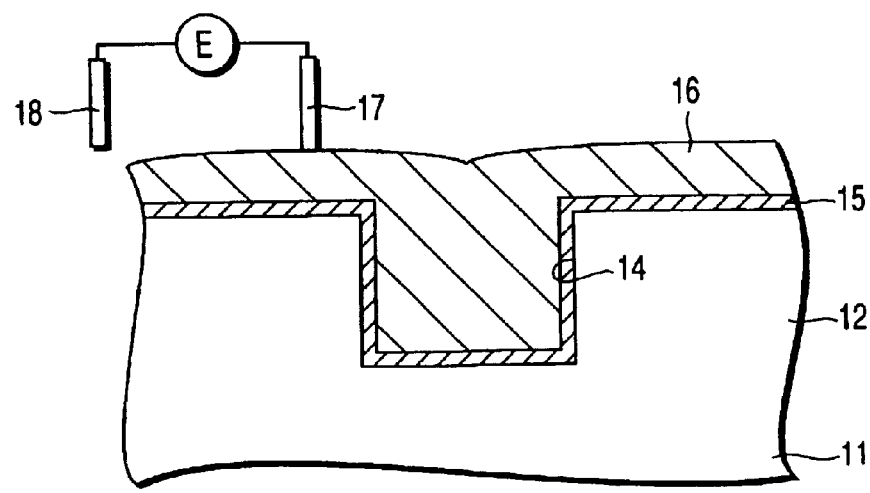
Figure 5:
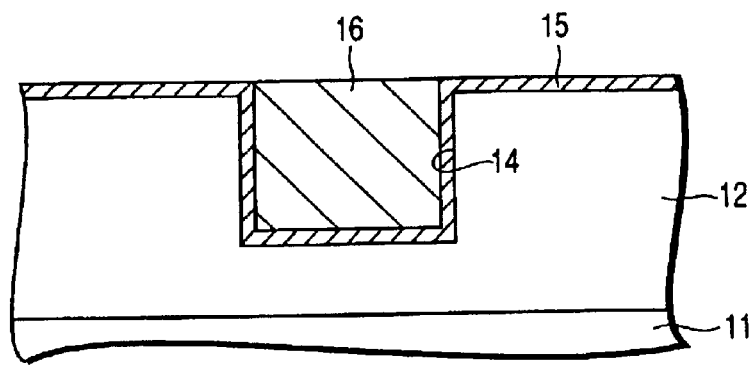
Figure 6:
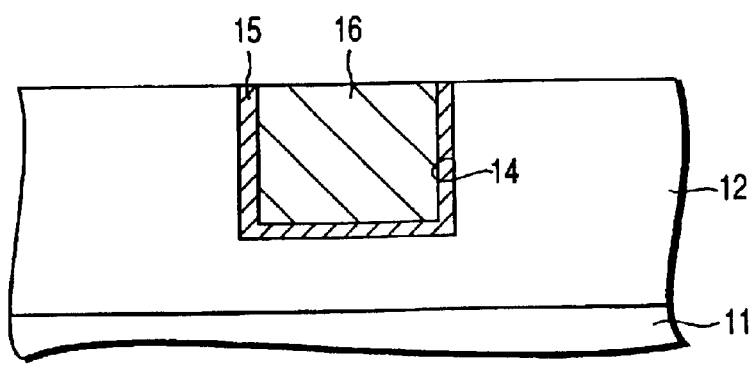

Then, the metallic wiring material layer 16 is subjected to an electropolishing treatment. In performing the electropolishing treatment, as shown in FIG. 4, a voltage is applied across an anode electrode 17 and a counter electrode 18, and the anode electrode 17 is scanned while keeping the anode electrode 17 in contact with the surface of the metallic wiring material layer 16 within an electrolytic solution (not shown). During the scanning of the anode electrode 17, the metallic wiring material 16 is ionized and dissolved in the electrolytic solution so as to be polished. In this fashion, the electropolishing treatment is continued until the surface of the barrier layer 15 on the upper surface of the insulating film 12 is exposed, as shown in FIG. 5. As the electrolytic solution, a solution of electrolyte such as phosphoric acid or sulfuric acid may be used.

After the electropolishing treatment, the barrier layer 15 on the upper surface of the insulating film 12 is removed by an ordinary CMP technology.

According to the first aspect of the present invention, the anode electrode 17 is entirely formed of an electrode material having a current density not higher than 10 mA/cm$^2$ upon application of a voltage of +2.5V vs. silver/silver chloride electrode within a 0.1 M perchloric acid solution in the electrochemical measurement using a potentiostat. According to the first aspect, the oxygen generation on the anode electrode can be suppressed even in the case of subjecting a wiring material made of a noble metal such as ruthenium to the electropolishing treatment so as to make it possible to efficiently electropolishing the wiring material made of a noble metal. The anode electrode material used includes, for example, a diamond like carbon. In performing the electropolishing treatment, generally, a current of 0.2 mA/cm$^2$–30 A/cm$^2$ is applied across the anode electrode and the counter electrode. The counter electrode can be formed of an ordinary counter electrode material such as Cu, W, Ru, Ag, Al, Pt or C.

Figure 7:
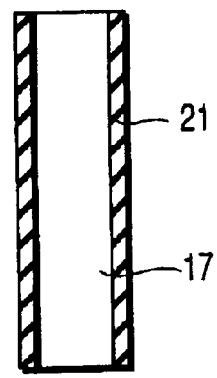
FIG. 7 is a cross sectional view schematically showing one example of anode electrodes used in electropolishing method according to one embodiment of the present invention.

According to the second aspect of the present invention, an anode electrode 17 having an insulating film 21 formed on the side surfaces as shown in FIG. 7 is used in the electropolishing method described above with reference to FIGS. 1 to 6. According to the second aspect, the contact area between the anode electrode and the electrolytic solution is decreased because the side surfaces of the anode electrode 17 except that surface portion which is brought into contact with the material to be electropolished (target material) are covered with the insulating film 21. As a result, it is possible to decrease the chance for the reductant such as OH$^-$ within the electrolytic solution to be brought into contact with the surface of the anode electrode so as to deprive the anode electrode of electrons and, thus, to be converted into an oxidant such as O$_2$. It follows that the current efficiency is improved in carrying out the electropolishing treatment. The insulating film 21 may be formed of an inorganic material such as SiO$_2$ or an organic polymer (insulating varnish) such as polycarbonate. In this case, the anode electrode 17 may be formed of an ordinary anode electrode material such as Cu, W, Ru, Ag, Al or Pt. The counter electrode 18 may be formed of an ordinary counter electrode material such as Cu, W, Ru, Ag, Al, Pt or C. A current of 0.2 mA/cm$^2$–30 A/cm$^2$ may be applied across the anode electrode and the counter electrode in carrying out the electropolishing treatment.

Figure 8:
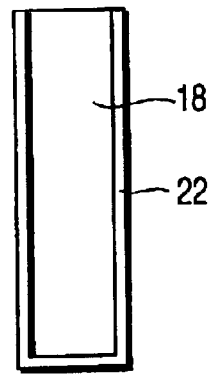
FIG. 8 is a cross sectional view schematically showing one example of counter electrodes used in electropolishing method according to one embodiment of the present invention.

According to the third aspect of the present invention, the counter electrode 18 having a solid electrolyte film, an ion exchange resin film, or a resistivity film (generically shown at 22) formed on the surface as shown in FIG. 8 is used in the electropolishing method described previously with reference to FIGS. 1 to 6. According to the third aspect, a solid electrolyte film, an ion exchange resin film or a resistivity film is present on the counter electrode so as to suppress, for example, the hydrogen generation on the counter electrode. As a result, the electric field is stabilized during the electropolishing treatment so as to apply a uniform electropolishing treatment to the material to be electropolished (target material). The solid electrolyte used in the present invention includes, for example, polyaniline, polyacetylene, polyparaphenylene, polythiophene, polypyrrol and polyacene. The solid electrolyte may be doped with an acceptor substance or a donor substance for controlling the resistivity. The acceptor substance includes, for example, halogen atoms such as Br, I, Cl and F; a Lewis acid such as BF$_3$ (or BF$^{4-}$), PF$_3$ (or PF$^{6-}$), AsF$_3$ (or AsF$^{6-}$), SbF$_5$ (or SbF$^{6-}$), or SO$_3$; a proton acid such as HNO$_3$, H$_2$SO$_4$, HCl, HF, FSO$_3$H, or CF$_3$SO$_3$H; a transition element halide such as FeCl$_3$, MoCl$_5$, SnCl$_4$ or MoF$_5$; and an organic substance such as chloral. The donor substance includes, for example, alkali metals such as Li, Na, K, and Cs, and alkyl ammonium such as tetraethyl ammonium and tetrabutyl ammonium.

The ion exchange resin includes, for example, a cation exchange resin having a matrix resin such as, for example, a polyhydric phenolic resin, a styrene-divinylbenzene resin or a fluororesin to which an acidic group such as an acidic hydroxyl group, a carboxyl group or a sulfonic group is bonded; and an anion exchange resin having the matrix resin noted above to which an basic group such as an amino group or a quaternary ammonium group is bonded.

Further, the resistivity film noted above can be formed of, for example, zeolite, zirconium phosphate, cellulose, alginic acid, humic acid, a chelate resin having an imidinoacetic acid group, di(2-ethyl hexyl) phosphate, or trioctyl amine.

In the third aspect of the present invention, the anode electrode can be formed of an ordinary anode electrode material such as Cu, W, Ru, Ag, Al or Pt. Also, the counter electrode can be formed of an ordinary counter electrode material such as Cu, W, Ru, Ag, Al, Pt or C. A current of 0.2 mA/cm$^2$–30 A/cm$^2$ is usually applied across the anode electrode and the counter electrode in carrying out the electropolishing treatment.

Incidentally, it is possible to employ a combination of the first aspect and the third aspect and another combination of the second aspect and the third aspect so as to obtain the merits of the combined aspects.

The present invention will now be described with reference to Examples of the present invention, though the present invention is not limited to the following Examples. In each of the Examples described below, the electropolishing is applied to the formation of a buried wiring layer described previously with reference to FIGS. 1 to 6.

EXAMPLE 1

An insulating film 12 of a low-k plasma silicon oxide was formed to a thickness of 0.6 $\mu$m by the ordinary plasma CVD method on the surface of a semiconductor substrate 11, followed by forming a wiring groove 14 of a prescribed pattern in a depth of 0.4 μm in the insulating film 12 by the ordinary RIE using a photoresist film 13.

Then, the photoresist film 13 was removed by the ordinary oxygen plasma ashing method, followed by forming a TiN barrier layer 15 to a thickness of 20 nm by the ordinary CVD method on the inner surface of the wiring groove 14 and on the upper surface of the insulating film 12. Further, a metallic wiring material layer 16 consisting of ruthenium was deposited by the ordinary CVD method to a thickness of 0.6 μm on the TiN barrier layer 15 formed on the surface of the insulating film 12, filling the wiring groove 14 and covering the surface of the insulating film 12.

After deposition of the metallic wiring material layer (ruthenium layer) 16, the ruthenium layer 16 except the portion positioned within the wiring groove 14 was subjected to an electropolishing treatment. The electropolishing treatment was carried out by using an anode electrode 17 consisting of a diamond like carbon (hyper-C). In carrying out the electropolishing treatment, a 0.1 M perchloric acid aqueous solution was used as the electrolytic solution, and the electropolishing treatment was carried out under a voltage of +2.5 V (vs. silver/silver chloride electrode). The ruthenium layer 16 was electropolished in 30 seconds so as to expose the barrier layer 15 formed on the surface of the insulating film 12. Then, the TiN barrier layer 15 and the ruthenium layer 16 corresponding to the thickness of the barrier layer 15 were removed by the ordinary CMP technology.

Figure 9:
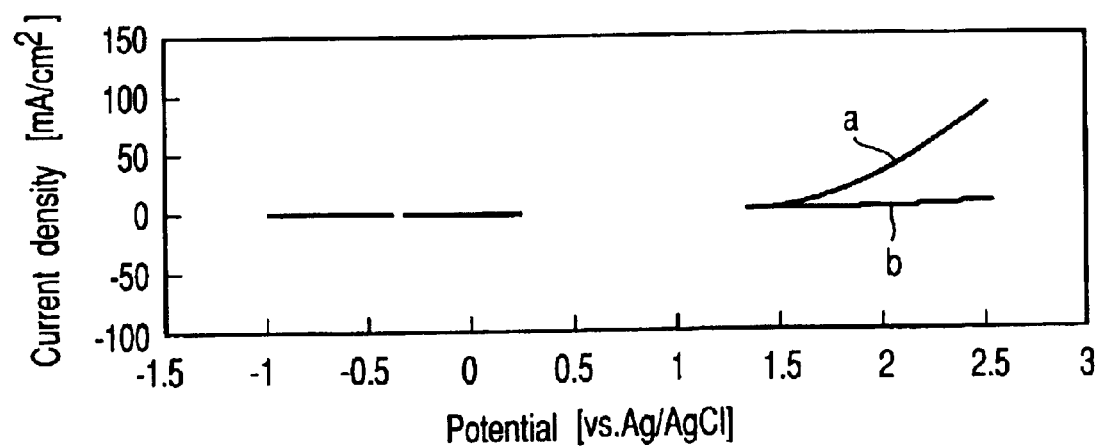
FIG. 9 is a graph showing the situation of an oxygen generation in the case of using a diamond like carbon and platinum as the anode electrode in the electrochemical measurement using a potentiostat.

Incidentally, the situation of the oxygen generation was observed at the time when a voltage of +2.5 V (vs. silver/silver chloride electrode) was applied within the 0.1 M perchloric acid solution in the electrochemical measurement using a potentiostat. As shown in FIG. 9, a current density of 100 mA/cm$^2$ derived from the oxygen generation was recognized in the case of using a platinum anode electrode, as denoted by curve "a". However, such a current was scarcely generated in the case of using a diamond like carbon, as denoted by curve "b". In the case of using the platinum electrode, the ruthenium layer was not polished even if the electrolysis was tried to be carried out under the same conditions.

EXAMPLE 2

A buried wiring was formed as in Example 1, except that a platinum electrode having an insulating film 21 formed on the side surfaces was used as the anode electrode 17. The insulating film 21 was formed of an insulating varnish, i.e., a mixture of urushiol, laccase, etc.

During the electropolishing treatment, an electric current flows not only through the anode/substrate interface but also through the anode/electrolytic solution interface so as to markedly lower the current efficiency. In this Example, however, an insulating film was formed on the side surfaces of the anode electrode except the contact surface between the anode electrode and the substrate. As a result, a current flowing through the anode/electrolytic solution interface was suppressed so as to improve the current efficiency.

EXAMPLE 3

A buried wiring was formed as in Example 1, except that a platinum electrode was used as a counter electrode 18, which had the entire surface covered with a perfluoro-sulfone type ion exchange resin film. The perfluoro-sulfone type ion exchange resin used was intended to block hydrogen ions. As a result, it was possible to suppress the hydrogen generation on the surface of the counter electrode so as to make it possible to carry out the electropolishing treatment under a stabilized electric field.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electropolishing method, comprising applying a voltage across an anode electrode and a counter electrode within an electrolytic solution while bringing said anode electrode into contact with a surface of a target material, thereby electropolishing the target material, wherein said anode electrode is formed of an electrode material having a current density not higher than 10 mA/cm2 upon application of a voltage of +2.5V vs. silver/silver chloride electrode within a 0.1 M perchloric acid solution in an electrochemical measurement using a potentiostat.

2. The method according to claim 1, wherein said anode electrode is formed of a diamond like carbon.

3. The method according to claim 1, wherein said target material is a buried metallic wiring material which is formed within a wiring groove provided within an insulating film above a semiconductor substrate, and covers a surface of said insulating film.

4. The method according to claim 3, wherein said electropolishing comprises polishing that portion of said wiring material which presents on said insulating film, selectively leaving the wiring material within said wiring groove.

5. An electropolishing method, comprising applying a voltage across an anode electrode and a counter electrode within an electrolytic solution while bringing said anode electrode into contact with a surface of a target material, thereby electropolishing the target material, wherein said anode electrode has an insulating film provided on a side surface thereof, and wherein said target material is a buried metallic wiring material which is formed within a wiring groove provided within an insulating film above a semiconductor substrate, and covers a surface of said insulating film.

6. The method according to claim 5, wherein said insulating film covers the entire surface of the anode electrode except the contact portion with said target material.

7. The method according to claim 5, wherein said insulating film comprises silicon oxide or polycarbonate.

8. The method according to claim 5, wherein said electropolishing comprises polishing that portion of said wiring material which presents on said insulating film, selectively leaving the wiring material within said wiring groove.

9. An electropolishing method, comprising applying a voltage across an anode electrode and a counter electrode within an electrolytic solution while bringing said anode electrode into contact with a surface of a target material, thereby electropolishing the target material, wherein said counter electrode has a solid electrolyte film, an ion exchange resin film or a resistivity film formed on a surface thereof, and wherein said target material is a buried metallic wiring material which is formed within a wiring groove provided within an insulating film above a semiconductor substrate, and covers a surface of said insulating film.

10. The method according to claim 9, wherein said solid electrolyte film comprises at least one member selected from polyaniline, polyacetylene, polyparaphenylene, polythiophene, polypyrrole and polyacene.

11. The method according to claim 9, wherein said solid electrolyte is doped with an acceptor substance or a donor substance.

12. The method according to claim 11, wherein said acceptor substance comprises at least one member selected from a halogen atom, a Lewis acid, a proton acid, a transition metal halide, and an organic substance.

13. The method according to claim 11, wherein said donor substance comprises at least one member selected from an alkali metal, and an alkyl ammonium.

14. The method according to claim 9, wherein said ion exchange resin is a cation exchange resin or an anion exchange resin.

15. The method according to claim 14, wherein said cation exchange resin comprises an acid group, and a matrix resin comprising at least one member selected from a polyhydric phenolic resin, a styrene-divinyl benzene resin and fluororesin.

16. The method according to claim 14, wherein said anion exchange resin comprises a basic group, and a matrix resin comprising at least one member selected from a polyhydric phenolic resin, a styrene-divinyl benzene resin and fluororesin.

17. The method according to claim 9, wherein said resistivity film comprises at least one member selected from zeolite, zirconium phosphate, cellulose, alginic acid, humic acid, a chelate resin having an imidinoacetic acid group, di(2-ethylhexyl) phosphate, and trioctyl amine.

18. The method according to claim 9, wherein said electropolishing comprises polishing that portion of said wiring material which presents on said insulating film, selectively leaving the wiring material within said wiring groove.

* * * * *